United States Patent [19]

Subbanna

[11] Patent Number: 5,731,619
[45] Date of Patent: Mar. 24, 1998

[54] CMOS STRUCTURE WITH FETS HAVING ISOLATED WELLS WITH MERGED DEPLETIONS AND METHODS OF MAKING SAME

[75] Inventor: Seshadri Subbanna, Brewster, N.Y.

[73] Assignee: International Business Machines Corporation, Armonk, N.Y.

[21] Appl. No.: 651,353

[22] Filed: May 22, 1996

[51] Int. Cl.$^6$ .......................... H01L 27/02; H01L 21/265
[52] U.S. Cl. .................. 257/374; 257/375; 257/376; 257/510
[58] Field of Search .......................... 257/371, 374, 257/510, 375, 376, 513, 372

[56] References Cited

U.S. PATENT DOCUMENTS

| | | | |
|---|---|---|---|
| 4,170,501 | 10/1979 | Khajezadeh | 148/175 |
| 4,260,999 | 4/1981 | Yoshioka | 357/34 |
| 4,416,050 | 11/1983 | Sarace | 29/571 |
| 5,045,904 | 9/1991 | Kobayashi et al. | 257/25 |
| 5,130,262 | 7/1992 | Masquelier et al. | 438/31 |
| 5,160,996 | 11/1992 | Odanaka | 257/375 |
| 5,250,829 | 10/1993 | Bronner et al. | 257/301 |
| 5,254,864 | 10/1993 | Ogawa | 257/273 |
| 5,268,588 | 12/1993 | Marum | 257/362 |
| 5,350,939 | 9/1994 | Honda et al. | 257/378 |
| 5,362,981 | 11/1994 | Sato et al. | 257/374 |
| 5,374,840 | 12/1994 | Arai | 257/372 |
| 5,384,474 | 1/1995 | Park et al. | 257/304 |
| 5,394,007 | 2/1995 | Reuss et al. | 257/544 |
| 5,422,299 | 6/1995 | Neudeck et al. | 438/63 |
| 5,471,419 | 11/1995 | Sankaranarayaman | 257/374 |
| 5,489,795 | 2/1996 | Yoshimura et al. | 257/369 |
| 5,661,329 | 8/1997 | Hiramoto et al. | 257/510 |

FOREIGN PATENT DOCUMENTS

| | | | |
|---|---|---|---|
| 2-077153 | 3/1990 | Japan | 257/410 |
| 4-346272 | 12/1992 | Japan | 257/410 |
| 4-359567 | 12/1992 | Japan | 257/410 |

OTHER PUBLICATIONS

Hayden, et al., IEEE Trans. Electron Devices, vol. 41, No. 12, Dec. 1994, pp. 2318–2325.

Primary Examiner—Donald Monin
Attorney, Agent, or Firm—Whitham, Curtis, Whitham & McGinn; Joseph P. Abate, Esq.

[57] ABSTRACT

A CMOS integrated circuit with field isolation including an NFET(s) having an isolated P-well, wherein the isolated P-well is adjusted so that it does not extend below the field isolation (e.g., STI) and the width and doping of the P-well and an underlying buried N-well is adjusted so that the depletion regions of the source/drain (S-D) diode and also the well-diode just meet (merge) without overlap in the P-well. The semiconductor device obtains bipolar effect and reduced junction capacitance in a bulk single-crystal technology. A method for fabricating the semiconductor device if also provided.

9 Claims, 1 Drawing Sheet

CMOS STRUCTURE WITH FETS HAVING ISOLATED WELLS WITH MERGED DEPLETIONS AND METHODS OF MAKING SAME

BACKGROUND OF THE INVENTION

1. Field of the Invention

The invention relates to a CMOS structure with FETS having isolated wells with merged depletion regions, and methods for their manufacture.

2. Description of the Related Art

Complementary metal-oxide semiconductor (CMOS) technology conventionally employs both NMOS and PMOS transistors to form the logic elements. As known, an important advantage of CMOS technology is minimized power consumption.

In the fabrication of CMOS structures, one conventional approach is to form NFETs with a P-well that directly connects to the P-substrate. However, for advanced CMOS technologies, the body-effect (i.e., the increase in $V_t$ with reverse bias on the well) reduces the performance and this becomes aggravated as the supply voltage is reduced. This problem has been eliminated by instead isolating each NFET in its own P-well. That is, another prior type of NFET design involves an N-well formed between the P+ substrate and the P-well in a multiple well process, as described, e.g., by J. Hayden et al., IEEE Trans. Electron Dev., v. 41, p. 2318 (1994). Also, electrically connected but independent p-wells formed in this manner are described, for example, in U.S. Pat. No. 4,170,501 (Khajezadeh). However, connected N-P wells eliminate the body effect only if each device has its own body-source connection, requiring extra layout area, and do not offer enhanced device current or reduced junction capacitance. Moreover, soft-error rate is high in conventional high-performance CMOS SRAMS formed in this manner due to small critical charge.

On the other hand, silicon-on-insulator (SOI) devices have been predicted to give better performance than bulk CMOS technology. Namely, SOI has about 50% better performance for the same channel-length due to bipolar effect caused by floating well, and reduced junction capacitances. However, there are many cost and material quality issues awaiting resolution before SOI can become a viable technology for commercial implementation. For example, the channel mobility in SIMOX (oxygen-implanted silicon) or SOS (silicon on sapphire) SOI materials is not comparable to that of bulk or epitaxial silicon. Also, there can be high and uncontrollable impurity concentration at the hetero-epitaxy interface as caused by autodoping from reaction of silane with the host crystal, or, in the case of SOS, the sapphire is reduced to aluminum which diffuses into the silicon layer. Also, high defect density problems can arise from either the oxygen implantation or from a mismatch between lattice constants of silicon and the host crystal. Moreover, it can be difficult to grow a device quality thin epitaxy layer as the lattice constant mismatch is most dense at the interface. Further, there can be compressive-tensile stress in the silicon film (stress in SOS is compressive) attributable to a difference in coefficient of linear thermal expansion between the silicon and the host crystal. While various approaches have been pursued to address the above-mentioned difficulties associated with SOI, no complete solution has been developed.

Therefore, there remains an unfulfilled need prior to the present invention for a CMOS structure and process of making same that isolates the p-well and reduces capacitance while retaining the high quality of the bulk (single-crystal) silicon so as to effectively combine the advantages of CMOS and SOI while avoiding their respective prior drawbacks.

SUMMARY OF THE INVENTION

It is an object of the present invention to provide a semiconductor device that obtains bipolar effect and reduced junction capacitance in a bulk single-crystal technology.

These and other objects, advantages, and benefits are achieved in the present invention providing a CMOS integrated circuit with local field isolation around active regions including a FET(s) having an isolated shallow well (e.g., an isolated P-well), where the width and doping of the shallow well to be isolated and an underlying buried well of opposite conductivity (e.g., a buried N-well) are adjusted so that the depletion regions of the source/drain (S-D) diode and also the P-N well-diode just meet (merge) in the shallow well. Additionally, another important feature of this invention resides in that the vertical depth of the shallow isolated well is made less than that of the adjoining field isolation means (e.g., shallow trench isolation, or simply "STI").

By isolating the shallow well in the above manner, the channel region is electrically isolated. Moreover, a much wider depletion region is provided, which, in turn, results in a lower drain capacitance. The isolated well that is formed in the isolated STI pockets is left floating, i.e., it is not tied to any supply, just as in an SOI. The isolated well to substrate junction is never forward biased due to the substrate being tied to a ground, and the buried n-well is tied to a supply (or to some other voltage). By keeping the well floating, the isolated well can be forward-biased by impact ionization on the drain flowing into the source, just as in a silicon-on-insulator (SOI). Generally, the current is on a 1 μA level and the well-junction has a leakage of less than 1 nA.

Additionally, if the isolated shallow well extended below the shallow trench isolation (STI) and connected with other wells (which scenario is avoided by the present invention), the capacitance. (P-N well) would increase by an order of magnitude, and the voltage would get tied to the other wells, which would remove and sacrifice much of the benefit obtained by the present invention. The present invention effectively prevents the isolated well from connecting with other wells.

The present invention additionally eliminates body-effect problems (increase in $V_t$ with reverse bias on the well) associated with prior CMOS by isolating each FET (e.g., an NFET) in its own well (e.g., a P-well). Indeed, this invention obtains better performance for the same channel-length due to bipolar effect and reduced junction capacitances in a bulk single-crystal technology. The bulk CMOS structure of the present invention provides many of the advantages associated with SOI while retaining the high quality of bulk (single-crystal-silicon).

This present invention also can be used to eliminate body effect on stacked NFETs, thereby maintaining performance. High soft-error rate in the CMOS structure due to small critical charge is reduced by the present invention due to collection of the charge from the SER event in the buried N-well.

Further, a drain/P-well/N-well area, such as provided in one embodiment of this invention, forms a punch-through diode, and if the depletion regions are too close there will be a lot of punch-through current. However, in the present invention, the isolated well is designed so that the depletion regions just merge at zero bias. This gives rise to some barrier lowering when there is zero V on the source (or drain), as compared to 1.8 V on the drain, however the punch-through current can be controlled as the barrier is still almost as much as in a P-N junction.

Methods for fabricating the inventive semiconductor device are also provided herein. The present invention is facile to implement, requiring only one extra mask as compared to conventional CMOS processing. For instance, in the case of NFETs made according to the invention, with the one extra mask, the deep part of an N-well implant is also implanted under the NFET's that require the buried N-layer. The N-well is tied to the supply (e.g., Vdd, 1.8 V, and so forth). The P-well for these NFETS can also be independently adjusted using another mask if necessary, however this is not critical to the invention. If necessary, contact can still be made to these isolated P-wells using a butted contact in the same STI well.

Again, the foregoing and other objects of the invention are realized by merging the isolated well and the source-drain depletion regions to isolate the well for floating well behavior and reduction of source-drain capacitance. Isolating wells according to the techniques embodied by the present invention endows the semiconductor device with many of the advantages of SOI without the material problems associated with SOI.

These and other objects and features of the invention will become more fully apparent from the several drawings and description of the preferred embodiments.

DETAILED DESCRIPTION OF THE PREFERRED EMBODIMENTS OF THE INVENTION

Figure 1:
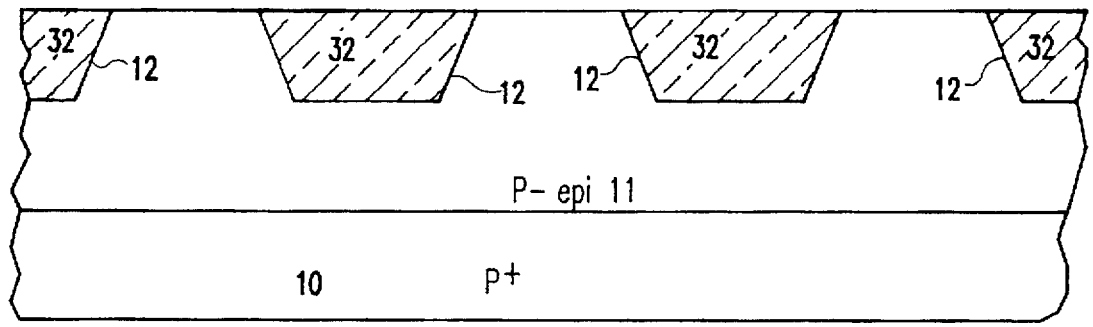
FIG. 1 illustrates an enlarged, cross-sectional view of an embodiment of the present invention at a stage of fabrications where the field isolation trenches have been formed.

Referring now to the drawings, there is shown a representative portion of a semiconductor structure of the present invention in enlarged, cross-sections at several stages of fabrication. Formation of a CMOS integrated circuit with shallow trench isolation is used for illustrative purposes. The drawings are not necessarily to scale, as the thicknesses of the various layers are shown for clarity of illustration and should not be interpreted in a limiting sense.

Referring to FIG. 1, in a preferred embodiment, a heavily doped P+ type semiconductor substrate wafer 10 is provided having a dopant of approximately $1 \times 10^{19}$ to $5 \times 10^{19}$ atoms/cm$^3$. A P-type epitaxial layer 11 ("P-epi") is grown on the upper surface of substrate 10 such as by known vapor phase spitaxial techniques. Epitaxial layer 11 is lightly doped and has a dopant concentration of less than approximately $5 \times 10^{16}$ atoms/cm$^3$ and has a thickness of 1 to 2 μm (1,000 to 2,000 nm). The surface of the P-epitaxial film 11 is patterned with a pad film (not shown). The pad film is an oxide/nitride layer having a thickness of about 175 nm which acts as an etch/polish stop in subsequent steps.

A high resolution photoresist is formed on the pad film and is patterned to define the etch mask for forming the shallow trenches 12 to be used to provide field isolation. The mask pattern is transferred to the pad film, such as by dry plasma etching. After stripping the photoresist, shallow trenches 12 of about 5500 A Å depths are etched into P-epitaxial layer 11 by anisotropic reactive ion etching (RIE) (or an anisotropic wet chemical etch) using the patterned pad film as an etch mask. The shallow trenches 12 are filled by conformally depositing oxide or polysilicon 32, preferably by chemical vapor deposition (CVD), to a thickness overfilling the trenches 12 above the plane of the surface of the epitaxial layer 11. Surface portions of the deposited oxide or polysilicon 32 are planarized, preferably by a combination of RIE etch-back and chemical-mechanical planarization (CMP). Thereafter, the pad film is stripped, such as by hot phosphoric acid and buffered HF, to provide the intermediate device structure as shown in FIG. 1.

While shallow trench isolation (STI) is illustrated herein, it is to be understood that field isolation also could be effected by LOCOS (local oxidation of silicon) or PELOX (poly-encapsulated LOCOS) technologies known to those skilled in the art. However, trench isolation is nonetheless generally preferred as it consumes less space and has no bird's beak encroachment problem. In any event, continuing with the processing protocol, a sacrificial (screen) oxide (not shown) is preferably grown at this stage of processing on the exposed substrate surfaces, as these will become the active device areas for N- and P-channel devices of the CMOS process into which the array of the invention is integrated.

Figure 2:
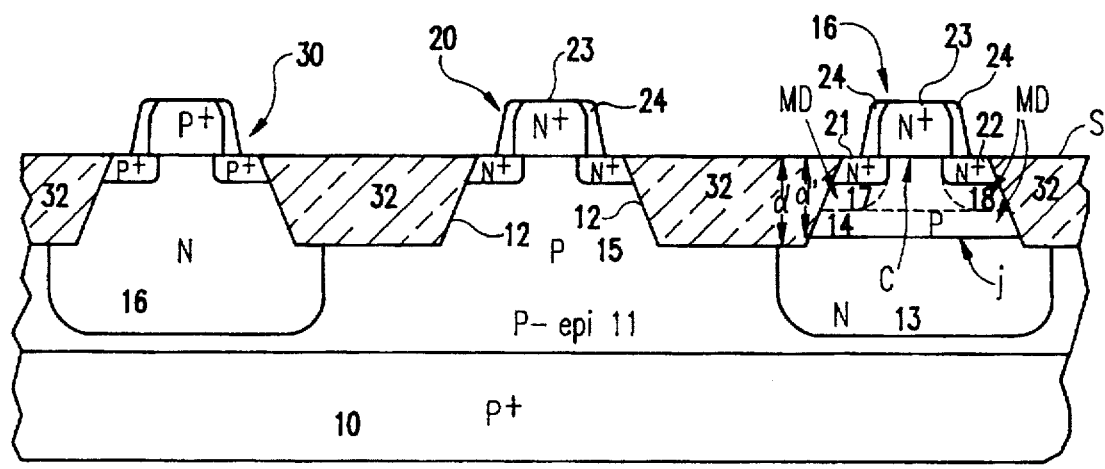
FIG. 2 illustrates an enlarged, cross-sectional view of an embodiment of the present invention at a stage of fabrication where the isolated P-well has been formed.

Next, and as seen in FIG. 2, buried N-layer 13 is formed by the use of an N-well mask that covers all of the substrate except where N-wells are desired and ion implantation in P-epitaxial layer 11 is effected by implanting phosphorus at an energy of approximately 500 to 1500 KeV and a dose of approximately $1 \times 10^{13}$ to $10 \times 10^{13}$ atoms/cm$^2$, resulting in a peak dopant concentration of approximately $5 \times 10^{17}$ to $5 \times 10^{18}$ atoms/cm$^3$. Arsenic or antimony optionally can be used as the N-type dopant. Using a separate P-well mask, P-well 14 is formed by implanting a P-dopant preferably comprised of boron at approximately 100–400 KeV at a dose of approximately $1 \times 10^{13}$ to $10 \times 10^{13}$ atoms/cm$^2$, resulting in a peak dopant concentration of approximately $1 \times 10^{17}$ to $5 \times 10^{17}$ atoms/cm$^3$. Conventional masking materials and thicknesses thereof used to provide the masking function for ion implantation can be used in this device processing, such as ion implantation masks made of photoresist, silicon dioxide, and silicon nitride. Also, as will be appreciated, the sequence of forming buried N-well 13 and P-well 14 can be reversed from that illustrated above. As seen in FIG. 2, P-well 14 is physically and electrically isolated by shallow isolating trenches 12 bounding lateral sides of the P-well 14 and underlying buried N-well 13 bounding the lower side of P-well 14.

As seen in FIG. 2, the depth "d'"" of p-well 14 is adjusted by controlling its implantation energy and/or dopant level so that it does not extend vertically below the vertical depth "d" of adjoining shallow trench isolation 12 (i.e., d'<d). A depleted region starts from the P-N junction "j" located vertically above the depth "d" of the STI's. A "depletion region" means a region in which the charge-carrier density is insufficient to neutralize the net fixed charge density of ionized donors and acceptors. If the P-well extends below the STI 12 and connects with other wells, the capacitance (P-N well) increases by an order of magnitude, and the voltage gets tied to the other wells, which removes much of the benefit.

Also, as seen in FIG. 2, the width and doping of the P-well 14 is adjusted by judicious management of the dopant concentrations and implantation energies used in forming P-well 14 (and N-well 13) such that the depletion regions 17, 18 of the source/drain diode and the well-diode just meet (merge) in the P-well 14 to provide merged depletions MD. This provides a much wider depletion region, which results in a lower drain capacitance. The P-well 14 that is thus formed in these isolated STI pockets is left floating (i.e., not tied to any supply), akin to a SOI structure. By keeping the P-well 14 floating, the P-well 14 can be forward-biased by impact ionization on the drain flowing into the source, akin to an SOI. Therefore, NFETs can be formed in the present invention with isolated P-wells, which are shallow and lightly doped, so as to be depleted between N-type source/drain junctions and a common N-well, thereby electrically isolating the channel regions.

In the present invention, buried N-well 13 and P-well 14 are formed at relatively shallow depths relative to the surface "s" of the semiconductor layer 11. For example, the deepest extent of the P-well 14 is typically less than 1 μm (1,000 nm), and the deepest extent of the N-well 13 is less than about 2 μm (2,000 nm) from surface "s".

The drain/P-well/N-well area of NFET 16 forms a punch-through diode. If the depletion regions were too close, there would be considerable punch-through current; however, the P-well 14 is designed so that the depletion regions just merge at zero bias in the present invention. While this arrangement gives rise to some barrier lowering when there is 0 V on the source 21 (or drain 22), as compared to 1.8 V on the drain, however, the punch-through current can be controlled as the barrier is still almost as much as in a P-N junction diode.

Therefore, by using merely one extra mask, the deep part of the N-well implant is also implanted under the NFETs that require the buried N-layer. This N-well 13 is tied to the supply (Vdd, 1.8 V, etc.). The P-well 14 for these NFETs can also be independently adjusted using another mask as necessary, however this is not critical to the invention. If necessary, contact can still be made to the isolated P-well 14 using a butted contact in the same STI well.

Other wells, e.g., P-well 15 and N-well 16, can also be formed by implantation techniques to elsewhere form in the same semiconductor device a conventional NFET 20 with a P-well that directly connects to the P-substrate 10, and to form a retrograde N-well 16 for a conventional PFET 30 device, respectively. NFET 20 and PFET 30 do not involve isolated wells, as depicted in the FIG. 20

In an alternative scheme of the processing steps of this invention, the P-well 14 can be formed prior to forming N-well 13 with the proviso that P-N junction "j" still must be located (vertically) above the bottom of the adjoining shallow trench isolation (STI) and the depletion regions of the source-drain (S-D) diode and the well-diode just meet in the P-well 14, as required above.

The rest of the process can proceed along the lines of conventional high-performance CMOS fabrication processing, such as exemplified in Hayden, J., et al., IEEE Trans. on Electron Devices, vol. 41, No. 12, December 1994, pp. 2318– 2325. For instance, a gate stack structure comprising the gate oxide (not shown), a conductive gate and a silicon nitride cap can be formed according to known techniques, such as described in U.S. Pat. No. 5,250,829 (Bronner et al.). For example, after stripping the sacrificial oxide referred to above, a gate insulator (oxide) is grown on the exposed surfaces of the substrate, and then polysilicon deposited thereover and dopedby ion implanting phosphorus in the case of an NFET, where the latter will serve as the lower gate electrode of the transistor. As known in the art, such a polysilicon layer is typically deposited by CVD and preferably it is doped, either in situ with its deposition or by way of subsequent doping in order to be quite conductive. A lower layer (not shown) of the overall gate electrode 23 depicted in the FIG. 2 is etched from the polysilicon layer with an appropriate mask. Optionally, lightly-doped implant extensions (not shown) can be formed at this juncture by masking and ion implantation of N-type dopant species. The sidewall dielectric spacer 24 (e.g., nitride, silicon oxide, metal oxides, and so forth) is formed on the lateral sides of gate electrode 23 by known methods.

A blocking mask is used to protect all of the device regions (including PFET regions) except where N-channel FETs are to be formed. The N+ source-drain regions 21, 22 are then implanted to define the N-channel "c" by implanting phosphorus ($3 \times 10^{15}$ atoms/cm$^2$ at 25 keV) or arsenic ($3 \times 10^{15}$ atoms/cm$^2$ at 50 keV) into the N-channel source/drain regions. After anneal (which may or may not be performed immediately after implant, as is well known in the art), the source/drain regions 21, 22 are formed defining a channel length of about 0.25 μm (250 nm). The P+ type diffusions for PFET devices are formed bythe use of a blocking mask to protect NFET regions. A refractory metal silicide layer (e.g., titanium, cobalt, tungsten or the like silicides) is formed and etched to clear unreacted metal to provide an upper gate layer (not shown) for gate electrode 23. Contacts and metallization can be defined (not shown) according to conventional practices in CMOS fabrication to complete the circuitry for the device.

Therefore, in a preferred semiconductor device of the present invention, the PFETs 30 are formed in a conventional way, i.e., with a (retrograde) N-well. The NFETS are of two types: (1) the first type of NFET 20 is a conventional NFET formed in a conventional manner to have a P-well that directly connects to the P-substrate; and (2) the second type of NFET 16 has an N-well between the P+ substrate and the P-well isolated according to the present invention.

The present invention is facile to implement, needing only one extra mask as compared to conventional high-performance CMOS fabrication technology. With the extra mask, the deep part of the N-well implant is also implanted under the NFET's that require the buried N-layer. This N-well is tied to the supply (e.g., Vdd, 1.8 V, and so forth). The P-well for these NFETS can also be independently adjusted using another mask if necessary, however this is not critical to the invention. If necessary, contact can still be made to these isolated P-wells using a butted contact in the same STI well. In an alternate embodiment of the invention, the conductivities of P-epitaxial layer 11, well 13, well 14, and source/drain regions 21, 22 can be switched to form an isolated N-well in layer 14. In yet another embodiment of this invention, an isolated P-well(s) and an isolated N-well (s) can be formed in the same semiconductor device according to practices of this invention.

This invention allows ease of use and compatibility with bulk CMOS, and it has advantages over SOI in material quality. While the present invention has been illustrated herein with CMOS, it is to be understood that the present invention is also applicable to high-performance logic, stand-alone SRAMs, and BiCMOS devices.

While the invention has been described in terms of a single preferred embodiment, those skilled in the art will recognize that many steps described above can be altered and that dopant species and types as well as other materials substitutions can be freely made without departing from the spirit and scope of the invention.

I claim:

1. A MOS transistor, comprising:

a semiconductor layer of a first conductivity type;

a field isolation means formed in said semiconductor layer having an isolation means depth;

a first shallow floating well of said first conductivity type, said floating well being laterally bounded between said field isolation means and having a maximum well depth that is less than said isolation means depth;

a second non-floating deeper well of a second conductivity type that is opposite to said first conductivity, said deeper well being located in said semiconductor layer and positioned below and bounding said floating well;

source and drain regions disposed within said floating well and located in surface regions of said semiconductor layer, said source and drain regions defining a channel region; and wherein said floating well has a width and doping level effective to create merged depletion regions between (a) a diode between said source and drain regions and said floating well, and (b) a diode between said deeper well and said floating well, thereby isolating said channel region.

2. A MOS transistor, comprising:

a semiconductor substrate material of a first conductivity type;

a semiconductor layer of said first conductivity type positioned on said semiconductor substrate;

shallow trenches formed in said semiconductor layer having a trench depth and being filled with an insulating material;

a first shallow floating Well of said first conductivity type, said floating well being laterally bounded between said shallow trenches and having a maximum well depth that is less than said trench depth;

a second non-floating deeper well of a second conductivity type that is opposite to said first conductivity, said deeper well being located in said semiconductor layer and positioned below and bounding said floating well and separating said floating well from said semiconductor substrate material;

source and drain regions disposed within said floating well and located in surface regions of said semiconductor layer, said source and drain regions defining a channel region; and wherein said floating well has a width and doping level effective to create merged depletion regions between (a) a diode between said source and drain regions and said floating well, and (b) a diode between said deeper well and said floating well, thereby isolating said channel region.

3. The CMOS transistor of claim 2, wherein said first conductivity type is P type.

4. The CMOS transistor of claim 2, wherein said floating well is doped with boron.

5. The CMOS transistor of claim 2, wherein said second conductivity type is N type.

6. The CMOS transistor of claim 2, wherein said second deeper well is doped with a dopant selected from the group consisting of arsenic, antimony, and phosphorus.

7. The CMOS transistor of claim 2, wherein said semiconductor layer has a thickness of approximately 1 to 2 µm.

8. The CMOS transistor of claim 2, wherein said semiconductor substrate material is a monocrystalline material.

9. The CMOS transistor of claim 8, wherein said semiconductor substrate material is a monocrystalline material selected from the group consisting of silicon and gallium arsenide.

* * * * *